United States Patent [19]

Shoji

[11] Patent Number: 4,782,253
[45] Date of Patent: Nov. 1, 1988

[54] HIGH SPEED MOS CIRCUITS

[75] Inventor: Masakazu Shoji, Warren, N.J.

[73] Assignee: American Telephone & Telegraph Company, AT&T Bell Laboratories, Murray Hill, N.J.

[21] Appl. No.: 99,702

[22] Filed: Sep. 21, 1987

Related U.S. Application Data

[63] Continuation of Ser. No. 768,501, Aug. 22, 1985, abandoned, which is a continuation-in-part of Ser. No. 580,232, Feb. 15, 1984, abandoned.

[51] Int. Cl.[4] .......................... H03K 5/05; H03K 5/01; H03K 5/06; H03K 5/12
[52] U.S. Cl. ..................................... 307/602; 307/451; 307/268; 307/269; 307/480
[58] Field of Search ............... 307/443, 448, 451, 268, 307/269, 244, 577, 579, 584, 585, 591, 592, 594, 595, 597, 481, 601-603, 605, 480

[56] References Cited

U.S. PATENT DOCUMENTS

| | | | |
|---|---|---|---|
| 3,702,446 | 11/1972 | Steudel | 307/595 X |
| 3,946,369 | 3/1976 | Pashley | 307/475 X |
| 4,069,429 | 1/1978 | White et al. | 307/595 X |
| 4,104,860 | 8/1978 | Stickel | 307/481 X |
| 4,346,343 | 8/1982 | Berndlmaier et al. | 307/595 X |
| 4,412,335 | 10/1983 | Froment et al. | 307/443 X |
| 4,479,216 | 10/1984 | Krambeck et al. | 307/269 X |
| 4,508,983 | 2/1985 | Allgood et al. | 307/443 X |
| 4,575,646 | 3/1986 | Saneski | 307/443 |

OTHER PUBLICATIONS

Gorajek, "Accurate Time-Delay from Two Inaccurate Circuits"; *Electronic Engineering*, pp. 20; 8/1978.
Dingwall, "Transistor Memory Precharge Circuit"; *RCA Tech. Notes;* TN No.: 1140; 2 pages, 2/18/76.
Farr, Jr., "Skew Compensation Circuit"; *RCA Technical Notes;* TN No.: 803; 11/15/1968, 3 pages.
*Large Scale Integration Devices, Circuits, and Systems,* M. J. Howes et al., (John Wiley & Sons, 1981), p. 120.

Primary Examiner—John S. Heyman
Assistant Examiner—David R. Bertelson
Attorney, Agent, or Firm—David I. Caplan; Jerry W. Herndon

[57] ABSTRACT

Integrated circuit chips with two (or more) multi-element logic paths—suffering from signal skew operation because of semiconductor processing variations—can be made to exhibit substantially reduced skew by designing the elements such that the sum of the pull-up delays in one logic path is approximately equal to the sum of the pull-up delays in the other logic path (or in each of the other logic paths) and such that the sum of all the delays (pull-down plus pull-up) in one path is substantially equal to the sum of all the delays in (each of) the other(s)—all in response to an input signal transition (low to high, high to low, or both) applied to each path.

7 Claims, 1 Drawing Sheet

HIGH SPEED MOS CIRCUITS

CROSS-REFERENCE TO RELATED APPLICATION

This is a continuation of my earlier application Ser. No. 768501 filed on Aug. 22, 1985, now abandoned, which is a continuation in part of application Ser. No. 580232, filed Feb. 15, 1984, now abandoned.

FIELD OF THE INVENTION

This invention relates to semiconductor integrated circuits (ICs) and more particularly to complementary-metal-oxide-semiconductor (CMOS) circuits in which the same signal is applied to two or more multiple-element paths for synchronized arrival of signals at the ends of the paths after propagation therethrough.

BACKGROUND OF THE INVENTION

CMOS integrated circuit chips including a plurality of multiple-element electrical paths, to each of which the same signal is applied, are well known in the art. A typical example comprises two paths intended for producing a pair of clock signals, one of the clock signals being the complement of the other. Each path includes a separate plurality of inverters connected electrically in a cascaded arrangement—one path typically including an odd number of cascaded inverters, the other path typically containing an even number—to produce clock signals that are complementary. A single clock signal is applied simultaneously as input to each of such paths for later recombination at either a clocked gate or a clocked storage device—i.e., a logic gate or a storage device (e.g., a D-type latch) whose timing is controlled by the pair of clock signals.

Multipaths of this type are characterized by signal propagation delays that suffer from uncontrolled variations. Especially serious are the variations in the delays that are caused by uncontrolled variations in certain semiconductor processing parameters. These variations in propagation delays cause skew, thus undesirably reducing the maximum clock rate at which such circuits are capable of operating. In this connection, the term "skew" refers either to the discrepancy between the actual time of arrival of a signal pulse edge and the expected time of its arrival or the discrepancy between the actual times of arrival of two signals which are supposed to arrive simultaneously.

For example, in the case of CMOS circuits containing PFETs and NFETs, as a result of certain kinds of variations in certain ones of the processing parameters, the delays in PFETs and NFETs are affected in the same way, so that little if any discrepancy occurs in the signal propagation delays as between two given paths; whereas as a result of other variations in processing parameters ("worst-case variations") the delays in PFETs and NFETs are affected in opposite ways, so that a relatively large discrepancy occurs in such delays as between the two paths. In present-day art, to obtain a minimum skew circuit design the sum of the delays of one path are set to equal the sum of the delays in the other under only a given set of processing conditions. But this setting of the total delays of one path equal to the total in the other, does not correct for process-induced variations in delays caused by variations in processing parameters that are more likely to be encountered in practice, and certainly does not correct for "worst-case" processing variations.

BRIEF SUMMARY OF THE INVENTION

This invention is based on the recognition that a significant reduction in skew normally introduced by process variations is achieved by setting the sizes of the inverters in each path so that—in response to an input transition in one direction, e.g., a sudden transition (pulse edge) from a low to a high voltage level, applied to the beginning of each path—the sums of the pull-up delays of the elements in the two paths are approximately equal (i.e., within about 10 to 15%), and the sums of all (pull-down plus pull-up) delays in the two paths are substantially equal (i.e., within about 1% or less). (Note that thereby the sums of the pull-down delays in the two paths are automatically approximately equal, since the sum of all delays in any path equals the sum of the pull-up delays plus the sum of the pull-down delays.) By "sudden" it is meant that the rise time is small compared with the propagation time through each inverter—i.e., rise time is less than about three times the propagation time. In addition, in response to an input transition in the opposite (e.g., downward) direction, the sums of the pull-up delays in the two paths are similarly to be made approximately equal, and the sums of all the delays are to be made substantially equal—to reduce skew in those cases where the path responses to input transitions in the opposite direction is also important. It should be recognized, of course, that in response to input transitions in the upward vs. downward directions, in a given inverter a PFET vs. an NFET will be active in pulling up vs. pulling down the given inverter, and that a given inverter will be active to pull-up vs. pull down—depending upon whether the given inverter pulls its own output up vs. down in response to the particular input transition. Thus, different constraints are imposed upon different transistors in response to input transitions in opposite directions, according to the invention. The result is a multipath logic circuit characterized by substantially reduced skew caused by variations in processing parameters, as well as reduced skew caused by variations in operating parameters such as voltage and temperature. Further reduction in skew can then be made by fine-tuning the skew, as by trial-and-error simulation of processing or other variation.

Since pull-up and pull-down delays of a gate are related to their transistor channel widths, circuits that are made in accordance with the teachings of this invention are thus characterized by a pair of CMOS paths having their field effect transistors (PFETs and NFETs) chosen such that the widths of the PFETs and NFETs in one path are related in a specified manner to the widths of the PFETs and NFETs in the other. In this connection, the term (gate) "length" refers to the length of the current path between a source and drain of a PFET or an NFET and the term (gate) "width" refers to the transverse dimension (i.e., perpendicular to the direction of current) of the P or N channel region of the PFET or the NFET. It should be noted, of course, that the skew caused by variations in operating parameters is not as severe a problem as the skew caused by variations in processing parameters, because variations in operating conditions affect PFETs and NFETs in substantially the same way whereas variations in processing parameters do not, so that the main concern ordinarily is the skew caused by variations in processing parameters.

DETAILED DESCRIPTION

Figure 1:
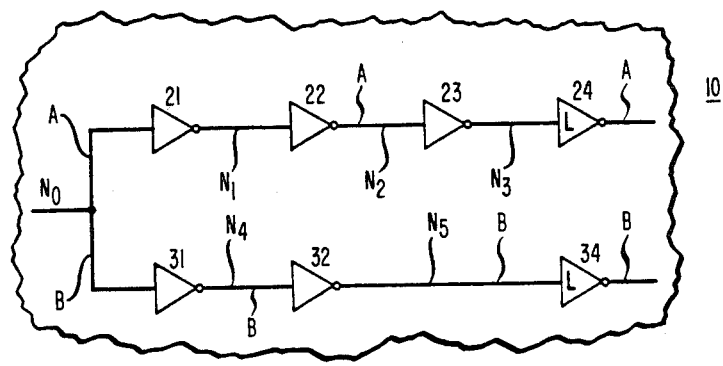
FIG. 1 is a circuit diagram of a prior art circuit which can be designed in accordance with the principles of this invention.

FIG. 1 shows circuitry 10 which is a portion of a semiconductor integrated circuit chip in which first and second logic paths A and B are shown with three and two inverter logic chains, respectively. The inverters of path A are designated 21, 22, and 23, as shown, and are connected in cascade between an internal node $N_0$ and an input node $N_3$ of a load denoted by L, which is typically formed by an inverter 24. Similarly, path B includes inverters 31 and 32 connected between node $N_0$ and the input node $N_5$ of another load (also denoted by L), typically another inverter 34.

Each inverter typically is formed by a PMOS transistor and an NMOS transistor whose electrical current paths (source-drain paths) are connected in series between first and second power lines, $V_{DD}$ and $V_{SS}$, the gate electrodes of the two transistors being connected together to receive an input signal. The output of the inverter is thus developed at a terminal located at a node in the series path between the two transistors as known in the art.

Node $N_0$ is typically connected to a clock pad (not shown) of a microprocessor, i.e., to a clock pulse source thereof, in which case the circuitry shown in FIG. 1 is a portion of the input-output (I/O) frame of the microprocessor.

When a signal propagates through a path consisting of a chain of inverters, corresponding to an upward input transition at $N_0$, then the first inverter 21 pulls down, the second 22 pulls up, the third 23 pulls down, etc.; whereas in response to a downward input transition the first inverter pulls up, the second pulls down, the third pulls up, etc.

It has been found that each of the signal delays through each inverter in any such path corresponding to an input transition in a given direction can be expressed as a product of, basically, two factors. One of those factors is a function of dimensionless factors determined only by ratios of transistor sizes (widths) in the consecutive inverters of the chains of inverters of a pair of multi-element paths, and this factor is substantially independent of variations in processing and operating (temperature and voltage) parameters. Another of those factors is indeed a function of and strongly dependent upon variations in processing and operating parameters. We can express the total delay in each chain as the sum of just two distinct terms: one for pull-up delays, the other for pull-down delays—because pull-up FETs are always PFETs, pull-down FETs are always NFETs, and PFETs and NFETs are processed under different conditions yet both contribute to delay.

More specifically, it has been recognized that processing variations result in uncontrollable changes in the length of the current path between the source and drain (the gate length) of a transistor. Such variations manifest themselves as changes in electrical conductance which determines the delay characteristic of the transistor. The equation for the total delay of a chain is represented (but only approximately, as discussed further later on) as a sum of two terms—where the first term includes only pull-up delays of the PFETs, and the second term includes only pull-down delays of the NFETs. Each term is a product of a coefficient and a variable: the coefficient being made up solely of dimensionless quantities that are not significantly influenced either by processing or by operating parameter variations, the variable being a factor which is indeed influenced by processing and operating variations. For a given input transition, however, the variable can be only either of two possible factors: one factor corresponding to pull-down (NFET), the other factor corresponding to pull-up (PFET). Thus the delay in a given inverter chain is represented as the sum of two terms $Q_N R_{11} + Q_P R_{12}$, where $R_{11}$ and $R_{12}$ are the above-mentioned coefficients, dependent upon various size ratios of certain transistors in the chain, and $Q_N$ and $Q_P$ are the two variables corresponding to NFETs and PFETs, respectively. The coefficients $R_{11}$ and $R_{12}$ are different for different chains, because coefficients for different chains depend upon the size ratios of transistors in the different chains; but the variables $Q_N$ and $Q_P$ are the same for all chains. For two chains A and B, the delay in A is thus given by the expression $Q_N R_{11}(A) + Q_P R_{12}(A)$, and the delay in B is thus given by the expression $Q_N R_{11}(B) + Q_P R_{12}(B)$. If each pull-down coefficient $R_{11}$ and each pull-up coefficient $R_{12}$ in each of the two paths is set separately equal to the other—i.e., if $R_{11}(A) = R_{11}(B)$ and $R_{12}(A) = R_{12}(B)$—then these two resulting equations specify two relationships among the transistor size ratios. If these relationships are satisfied, the variable terms (corresponding to processing and operating parameter variations) in the two equations track one another separately; that is to say, both the process and the operating variations will then influence the total delay in each chain in exactly the same way, and hence these variations do not cause skew for input transitions in the given direction.

The details of the delay coefficients $R_{11}$ and $R_{12}$ of a path including a chain of inverters are derivable as follows. Consider an n-stage chain of inverters, and denote the size (width) in microns of each of the P and N field effect transistors (PFETs and NFETs) of the i'th stage in the chains by $P_i$ and $N_i$, respectively. We will assume (arbitrarily) that the (n+1)th stage is a load and that the first stage is driven by a relatively low impedance pulse source, as is usually the case. For the case where the input voltage makes an upward (low to high) transition, the total delay $T_d(\uparrow)$ of the chain can be represented as $$T_d(\uparrow) = \frac{C}{\mu_N(V_{DD} - V_{THN})} \times \frac{(P_2 + N_2) + f(P_1 + N_1)}{N_1} + \frac{C}{\mu_P(V_{DD} - V_{THP})} \times \frac{(P_3 + N_3) + f(P_2 + N_2)}{P_2} + \cdots + \frac{C}{\mu_N(V_{DD} - V_{THN})} \times \frac{(P_{n+1} + N_{n+1}) + f(P_n + N_n)}{N_n}; \quad (1)$$

(the last term being as written above if n is an odd number) or the last term being, if n is even:

$$+ \frac{C}{\mu_P(V_{DD} - V_{THP})} \times \frac{(P_{n+1} + N_{n+1}) + f(P_n + N_n)}{P_n};$$

where C is a universal constant for upward input transitions, $\mu_N$ and $\mu_P$ are the electron and hole mobilities, and $V_{THN}$ and $V_{THP}$ are the threshold voltages of the NFETs and PFETs, respectively. The total delay $T_d(\downarrow)$ for a high to low transition of the input voltage can be written in a similar way, remembering that a pull-down in a given stage is replaced by a pull-up, and vice versa:

$$T_d(\downarrow) = \frac{C}{\mu_P(V_{DD} - V_{THP})} \times \frac{(P_2 + N_2) + f(P_1 + N_1)}{P_1} + \quad (1a)$$

$$\frac{C}{\mu_N(V_{DD} - V_{THN})} \times \frac{(P_3 + N_3) + f(P_2 + N_2)}{N_2} + \ldots +$$

$$\frac{C}{\mu_P(V_{DD} - V_{THP})} \times (P_{n+1} + N_{n+1}) + \frac{f(P_n + N_n)}{P_n};$$

(the last term if n is odd) or if n is even:

$$+ \frac{C}{\mu_N(V_{DD} - V_{THN})} \times \frac{(P_{n+1} + N_{n+1}) + f(P_n + N_n)}{N_n};$$

where C' is a universal constant for downward input transitions. Equations 1 and 1a can be derived by straightforward application of known circuit principles involving charge and discharge time constants, such constants being set forth for instance in the textbook, *Large Scale Integration Devices, Circuits, and Systems*, edited by M. J. Howes and D. V. Morgan, at page 120 beneath their Equation 3.47 (1981).

The factor f in Equations 1 and 1a is a dimensionless factor specifying the ratio of drain capacitance to gate capacitance. The delays $T_d$ may thus also be represented in the form as expected.

$$T_d(\uparrow) = Q_N \times R_{11} + Q_P \times R_{12} \quad (2)$$

$$T_d(\downarrow) = Q'_N \times R_{21} + Q'_P \times R_{22}; \quad (2a)$$

By inspection of Equations 1 and 1a, it is seen that by setting $$Q_N = \frac{C}{\mu_N(V_{DD} - V_{THN})}, \ Q_P = \frac{C}{\mu_P(V_{DD} - V_{THP})},$$

$$Q'_N = \frac{C'}{\mu_N(V_{DD} - V_{THN})}, \text{ and } Q'_P = \frac{C'}{\mu_P(V_{DD} - V_{THP})},$$

it follows that $$R_{11} = \frac{(P_2 + N_2) + f(P_1 + N_1)}{N_1} + \quad (3a)$$

$$\frac{(P_4 + N_4) + f(P_3 + N_3)}{N_3} + \ldots,$$

$$R_{12} = \frac{(P_3 + N_3) + f(P_2 + N_2)}{P_2} + \quad (3b)$$

$$\frac{(P_5 + N_5) + f(P_4 + N_4)}{P_4} + \ldots,$$

$$R_{21} = \frac{(P_3 + N_3) + f(P_2 + N_2)}{N_2} + \quad (3c)$$

$$\frac{P_5 + N_5 + f(P_4 + N_4)}{N_4} + \ldots,$$

and $$R_{22} = \frac{(P_2 + N_2) + f(P_1 + N_1)}{P_1} + \quad (3d)$$

$$\frac{(P_4 + N_4) + f(P_3 + N_3)}{P_3} + \ldots;$$

where, $Q_N$, $Q_P$, $Q'_N$, and $Q'_P$ are process, temperature, and voltage dependent parameters, whereas $R_{11}$, $R_{12}$, $R_{21}$, and $R_{22}$ are dimensionless factors that are relatively independent of these parameters.

The two delays—upward transition and downward transition, respectively—of two paths, say paths A and B of FIG. 1, can thus be represented as the four delays: $T_d(\uparrow)_A$ and $T_d(\downarrow)_A$, respectively, for path A, $T_d(\uparrow)_B$ and $T_d(\downarrow)_B$, respectively, for path B, as given by $$T_D(\uparrow)_A = Q_N R_{11}(A) + Q_P R_{12}(A)$$

and $$T_D(\downarrow)_A = Q_N R_{21}(A) + Q_P R_{22}(A); \quad (3)$$

$$T_D(\uparrow)_B = Q_N R_{11}(B) + Q_P R_{12}(B)$$

and $$T_D(\downarrow)_B = Q_N R_{21}(B) + Q_P R_{22}(B); \quad (4)$$

where, for example, $R_{12}(A)$ is given by Equation 3b above, with the channel widths $P_i$ and $N_i$ all taken from the corresponding transistors of the inverters along the path A, and $R_{22}(B)$, for example, is given by Equation 3d above, with the channel widths all taken along the path B. If the paths are designed, in accordance with the invention, such that $R_{11}(A) = R_{11}(B)$, $R_{12}(A) = R_{12}(B)$, then the delays of the two paths are equal for upward input transitions, and also track each other in the face of processing, etc., variations. Likewise, if the paths are designed such that $R_{21}(A) = R_{21}(B)$ and $R_{22}(A) = R_{22}(B)$, then the delays of the two paths are equal for downward input transitions, and likewise also track each other. This result can be seen from Equations 3 and 4, because for the correct choice of transistor sizes, to satisfy conditions $R_{11}(A) = R_{11}(B) \ldots$, those terms of Equations 3 and 4 which are process, temperature, or voltage dependent track one another very nearly exactly for all reasonable changes in processing or operating conditions. As a consequence, undesirable process-dependent race conditions can be avoided, and more nearly virtually skewless inversions of clock signals become feasible.

Figure 2:
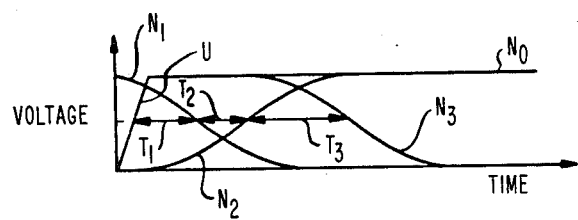
FIGS. 2 and 3 are graphical representations of the output waveforms of the circuit of FIG. 1 defining the delays of various elements in the circuit.
Figure 3:
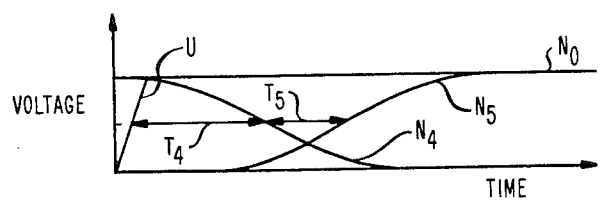

The circuit of FIG. 1 supplies a pair of CMOS clock pulses. Nodes $N_5$ and $N_3$ of FIG. 1 supply a clock pulse and its inversion. The voltage waveforms for nodes $N_0$–$N_5$ are shown in FIG. 2. Inversion delays $T_1$, $T_2$, $T_3$, $T_4$ and $T_5$ are also defined and indicated in FIGS. 2 and 3 for the case of an upward input transition U. More specifically: $T_1$ is the delay of signal propagating from node $N_0$ to node $N_1$ (i.e., through the inverter 21); $T_2$, from node $N_1$ to $N_2$; $T_3$, from node $N_2$ to $N_3$; $T_4$, from node $N_0$ to $N_4$; $T_5$, from $N_4$ to $N_5$. Note that $T_1$, $T_2$, and $T_3$ are delays along path A; $T_4$ and $T_5$ are along path B; all these delays being in response to an upward transition of input at node $N_0$.

For the sake of distinguishing circuit response to upward or downward input transitions, the signal $T_i(\uparrow)$ will denote delay of i'th inverter in response to an upward input transition, and $T_i(\downarrow)$ will denote the delay for a downward input transition. According to the principles of the present invention, the circuit having two paths A and B is configured so that $R_{11}(A) = R_{11}(B)$, $R_{12}(A) = R_{12}(B)$, i.e., so that according to Equations 3 and 4:

$$T_1(\uparrow) + T_3(\uparrow) = T_4(\uparrow), \text{ and } T_2(\uparrow) = T_5(\uparrow). \tag{5}$$

It is clear that in this case, the delays due to PFETs and the delays due to NFETs are separately equalized in the two paths for an upward transition of the input at node $N_0$. The same type of equalization—to wit, $R_{21}(A) = R_{21}$ and $R_{22}(A) = R_{22}(B)$—can instead, or in addition, be imposed for a downward transition of the input, in which case:

$$T_1(\downarrow) + T_3(\downarrow) = T_4(\downarrow), \text{ and } T_2(\downarrow) = T_5(\downarrow). \tag{5a}$$

Prior art circuits of this type are designed, as mentioned above, only so that for either an upward or a downward input transition:

$$T_1 + T_2 + T_3 = T_4 + T_5. \tag{6}$$

Equation 6, of course, is automatically satisfied for an upward input transition in all cases where, in accordance with the invention, Equation 5 is satisfied, but not vice versa. Similarly for a downward input transition when Equation 5a is satisfied. Consequently, skew is exhibited by prior art which are designed to satisfy only Equation 6, i.e., which do not also satisfy Equation 5. On the other hand, although Equation 5 has been derived on the basis of a specific circuit and transistor device model, it can be shown to be derivable independently of such a model, as is demonstrated in the APPENDIX below.

Two versions of the circuit of FIG. 1 were designed with the following FET sizes:

| Gate | Version 1 | | Version 2 | |
|---|---|---|---|---|
| 21 | P = 10 | N = 4 | P = 10 | N = 4 |
| 22 | P = 19 | N = 18 | P = 10 | N = 4 |
| 23 | P = 32 | N = 13 | P = 40 | N = 16 |
| 31 | P = 5 | N = 2 | P = 7 | N = 3 |
| 32 | P = 20 | N = 8 | P = 50 | N = 20 |
| Load (24 and 34) | P = 106 | N = 40 | P = 100 | N = 40 | where P and N are the channel widths in like units where a unit is 3.75 microns. Version 1 satisfies only Equation 6, and only for an upward input transition; but Version 2 satisfies Equation 5 as well as Equation 6, again only for an upward input transition. Both versions are substantially skew free at 5.0 volts supply voltage ($V_{DD} = 5.0$; $V_{SS} = 0.0$), 105 degrees C. operating conditions and an ordinary set of processing conditions. But Version 1 shows substantial undesirable skew for another ordinary set of processing conditions (see table below) whereas the circuit of Version 2 does not.

The following Table shows the magnitudes of the skew, $(T_1 + T_2 + T_3) - (T_4 + T_5)$, for Versions 1 and 2, for two sets of processing parameters varying from the original values in such a manner that the widths of all NFETs increase while those of all PFETs devices, and vice versa, all for upward input transitions are shown in the following Table:

| FET | Version 1 | Version 2 |
|---|---|---|
| NFET-higher current PFET-lower current | 0.75 NS | $\approx$0.00 NS |
| NFET-lower current PFET-higher current | 0.38 NS | <0.02 NS |

Here in this Table, for example, the term "N-higher current, P-lower current" refer to a case where the processing modified so as to cause the NMOS transistors to have shorter channels (shorter source to drain distances) and hence to conduct more current when they are in their on conditions, and to cause the PMOS transistors to have longer channels and hence to conduct less current when in their on conditions.

The values of the skew for Versions 1 and 2 as given in this Table were calculated by a computer circuit-simulation machine rather than observed by actual testing of physically operating circuits. As to the effects of variations in operating parameters such as operating temperature and voltage, such variations are not so serious a problem as processing variations of the kind illustrated in the Table, i.e., of the kind where the widths of the channels and hence the size of the delays of PFETs and NFETs are affected in opposite directions.

It is important to stress that the above Equations (except for Equation 6) are only approximately correct in practice because, for example, in response to the upward input transition U (FIGS. 2 and 3) the pull-down NFETs in the inverters 22 and 32 will indeed affect to some degree the time it takes these inverters to pull up their outputs, but the effects of these N-FETs has been neglected in deriving the above Equations. Hence, in practice the delay of each path also depends upon the precise details of the waveform of the input transition U, which has thus also been neglected above. That is why, all of the above equations, except for Equation 6, are approximations and are valid to within about 10 to 15%. Moreover, for achieving more reduction in skew, the value of $T_4/(T_4 + T_5)$—that is, the fraction of the total delay produced by the inverter 32—should be selected to be in the approximate range of 35% to 50%. Similarly, the value of $T_2/(T_1 + T_2 + T_3)$—that is, the fraction of the total delay produced by the inverter 22—should likewise be in the approximate range of 35% to 50%. These limitations on the ranges of $T_4$ and $T_2$ in practice do not cause much, if any, added difficulty to the selection of circuit design parameters in accordance with the invention.

It is thus clear that all skew can be considerably reduced by setting the total delays in the two paths equal to each other, while setting the sums of the pull-up delays in the two paths approximately equal to each other (and hence simultaneously having the sums of the pull-down delays approximately equal to each other).

Although the invention has been described in detail in terms of a specific embodiment, various modifications can be made without departing from the scope of the invention.

APPENDIX

The purpose of this APPENDIX is to demonstrate how equations of the form of Equations 5 and 6 can be extended to two paths containing any number of inverters and can be derived on the basis of more general principles, i.e., principles that are independent of the precise details of transistor operation so long as such operation is characterized in that, in response to an upward input transition applied to the two paths, in each inverter either a PFET is active and pulls up the output voltage or else an NFET is active and pulls down the output voltage of that inverter. Thus, in response to the upward input transition, in the first inverter of each path an NFET pulls down the output voltage of the first inverter, in the second inverter of each path a PFET pulls up the output voltage, etc.—i.e., in the odd-numbered inverters an NFET is active, and in the even-numbered inverters a PFET is active.

Consider two paths, one path A having n cascaded inverters and the other path B having m cascaded inverters. For a given set of processing parameters, say the typical set of parameters, labelling the successive delays of the successive inverters in one path as $T_1, T_2, T_3, \ldots T_n$, and in the other path by $T_{n+1}, T_{n+2}, \ldots T_{n+m}$, then the total delays $T_A$ and $T_B$ in the first and second paths A and B, respectively, are given by $$T_A = T_1 + T_2 + \ldots + T_n \tag{7}$$

$$T_B = T_{n+1} + T_{n+2} + \ldots + T_{n+m} \tag{7a}$$

Of course, if n is an even number, then the first path is overall non-inverting; and if n is an odd number, then the first path is overall inverting; similarly, if m is odd, the second path is overall non-inverting; and if m is even, the second path is overall inverting. In any event, only for the sake of definiteness, it will be assumed that the first path is non-inverting (n is even) and the second path is inverting (m is odd). For another, atypical set of processing parameters, the pull-down delays (due to atypical NFET parameters) in both the first and second paths all become multipled by the same N-factor say $g_N$ (e.g., all the NFET channel lengths are increased by the factor $g_N$) while the pull-up delays in both the first and second paths all become multiplied by the same P-factor, say $g_P$ (e.g., all the PFET channel lengths are increased by the factor $g_P$), with the N-factor $g_N$ and the P-factor $g_P$ being unequal in general though not necessarily always. Thus, the new total delays $T_A(g)$ and $T_B(g)$, i.e., resulting from the atypical set of parameters, in the first and second paths, respectively, will be given by $$T_A(g) = (T_1 + T_3 + \ldots + T_{n-1})g_N + (T_2 + T_4 \ldots + T_n)g_P \tag{8}$$

$$T_B(g) = (T_{n+1} + T_{n+3} + \ldots T_{n+m})g_N + (T_{n+2} + T_{n+4} + \ldots T_{n+m-1})g_P \tag{8a}$$

since, in response to the upward input transition, in the first, third, fifth, etc., inverters in both paths (counting successively from the input side of each path) the NFETs are active and pull down, while in the second, fourth, etc., inverters in both paths the PFETs are active and pull up. From Equations 7 and 8, 7a and 8a, it directly follows that $$T_A(g) = (T_1 + T_3 + \ldots + T_{n-1})g_N + \tag{9}$$
$$[T_A - (T_1 + T_3 + \ldots + T_{n-1})]g_P$$

$$T_B(g) = (T_{n+1} + T_{n+3} + \ldots T_{n+m})g_N + \tag{9a}$$
$$[T_B - (T_{n+1} + T_{n+3} + \ldots T_{n+m})]g_P$$

Thus, if $[T_A(g) - T_B(g)] = 0$; i.e., if there is to be zero skew under the atypical set of processing parameters, and if also $[T_A - T_B] = 0$, i.e., if there is to be zero skew under the typical set of parameters; then it follows from Equation 9 and 9a that, for zero skew under the atypical set, i.e., for the case $T_A(g) = T_B(g)$:

$$(g_N - g_P)(T_1 + T_3 + \ldots + T_{n-1}) = (g_N - g_P)(T_{n+1} + T_{n+3} + \ldots T_{n+m}) \tag{10}$$

Thus, there will be zero skew if either $g_N = g_P$ or $$T_1 + T_3 + \ldots + T_{n-1} = T_{n+1} + T_{n+3} + \ldots T_{n+m} \tag{11}$$

Equation 11 says that the sum of the pull-down delays in the first path equals the sum of the pull-down delays in the second path. Of course, the condition $g_N = g_P$ means that the changes in the delays of PFETs in going from the typical to the atypical set of processing parameters were similar to the changes in the delays of NFETs, i.e., multiplication by the same factor $g_P g_N$ for each delay, PFET or NFET. Since such a constraint as $g_P = g_N$ is not likely to be realized in practice, therefore in order to maintain equal path delays $T_A = T_B$ and $T_A(g) = T_B(g)$ for both the typical and atypical sets of processing parameters, and to do so regardless of the magnitude of the resulting discrepancies between $g_N$ and $g_p$, Equation 10 should be satisfied. On the other hand Equation 10 was derived under the supposition that $T_A = T_B$, i.e., the supposition of zero skew for the typical set of processing parameters. Thus, it follows from $T_A = T_B$, together with Equations 7, 7a, and 10, that for zero skew under the atypical set of processing parameters (where $g_N$ and $g_P$ are unequal):

$$T_2 + T_4 + \ldots + T_n = T_{n+2} + \ldots T_{n+m-1} \tag{12}$$

Equation 12 says that the sum of the pull-up delays in the first path equals the sum of the pull-up delays in the second path. Thus, the necessary and sufficient conditions for zero skew under atypical sets of processing parameters (for which $g_N$ and $g_P$ are unequal) are given by Equations 11 and 12 in the case of an upward signal input transition. Notice that if Equations 10 and 11 are both satisfied for an upward input transition, as desired in the invention, then automatically according to Equations 7 and 7a it follows that also $T_A = T_B$: that is, if in response to an upward input transition the sums of the pull-up delays in the two paths are equal to each other and the sums of the pull-down delays in the two paths are equal to each other, then the total delays in the two paths will automatically be equal to each other, only the latter equality being satisfied in prior art.

Similarly, if it is desired to reduce skew in the case of a downward, instead of upward, input signal transition, then according to the invention, in response to an upward signal input signal transition, the sum of the pull-up delays in the first path is made equal to the sum of the pull-up delays in the second path and the sum of the pull-down delays in the first path is made equal to the sum of the pull-down delays in the second path. In other words, Equations 11 and 12 are satisfied for the downward input signal transition. Finally, if it is desired to reduce skew in the cases of both upward and downward input transitions, then the PFETs and NFETs of the inverters are made so that Equations 11 and 12 are satisfied both for upward and downward input signal transition.

Notice that if an upward input transition renders active the PFET of a given inverter so that the inverter pulls up its own output, then a downward input transition will render active the NFET of same inverter so that the inverter will pull down its own output; and hence, interchanging upward with downward input transitions will result in interchanging pull-up with pull-down delay of a given inverter. Therefore, satisfying Equations 10 and 11, in accordance with the invention, for the case of an upward input transition involves different transistors from those involved in the case of satisfying Equations 10 and 11 for a downward input transition. In any case, control of the time delays $T_1, T_2 \ldots T_n, T_{n+1}, T_{n+2}, \ldots T_{n+m}$ to satisfy Equations 10 and 11 can be achieved by suitable design of the individual transistors—i.e., suitable choices of the channel widths of the individual PFETs and individual NFETs in the two paths. Notice that even where there is but one inverter (plus load) in one path and two inverters (plus same load) in the other path, the number of constraints imposed by Equations 10 and 11 for both upward and downward input transitions are but two plus two, i.e., four, in number whereas the number of variables—i.e., width-ratios—is five (two widths in each of the three inverters, a total of six widths, or five width-ratios), which is already (aside from the variables of load parameters) more than enough to satisfy four equations.

What is claimed is:

1. An integrated circuit chip including first and second logic paths to which electrical signals are to be applied simultaneously, said first and second paths composed respectively of a plurality of logic elements characterized by high input impedance and connected in cascade, each of such elements having a characteristic pull-up and a characteristic pull-down delay, wherein in response to a rising input signal transition applied to an input end of each of the first and second paths the sum of the pull-down delays of the elements in said first path that pull-down their respective outputs in response thereto substantially equals the sum of the pull-down delays of the elements in said second path that pull-down their respective outputs in response thereto and in response to a falling input signal transition applied to the input end of each of the first and second paths the sum of the pull-up delays of the elements in said first path that pull-up their respective outputs in response thereto substantially equals the sum of the pull-up delays of the elements in said second path that pull-up their respective outputs in response thereto.

2. An integrated circuit chip in accordance with claim 1 wherein each of said elements in said first and second paths comprise one or more transistors and wherein the widths of said transistors in said elements in said first and second paths are selected so that the said sum of the said pull-down delays in the first path substantially equals the said sum of the said pull-down delays in the second path and the said sum of the said pull-up delays in the first path substantially equals the said sum of the said pull-up delays in the second path.

3. An integrated circuit chip in accordance with claim 2 wherein the numbers of elements in said first and second paths are different.

4. An integrated circuit chip in accordance with claim 3 wherein all said pull-up and all said pull-down transistors are PFETs and NFETs, respectively, which formed during different first and second semiconductor processing operations, respectively.

5. An integrated circuit chip comprising at least two logic paths to each of which electrical signals are to be applied simultaneously, said paths having differing respective numbers of logic elements connected in cascade, each of said elements having either a pull-up delay or a pull-down delay in response to an input signal applied to the paths, such that in response to a rising input signal the sums of the pull-down delays of those logic elements which pull-down their respective outputs in response thereto in each path are substantially equal and such that in response to a falling input signal the sums of the pull-up delays of those logic elements which pull-up their respective outputs in response thereto in each path are substantially equal.

6. An integrated circuit chip in accordance with claim 5 wherein said electrical signal is a clock signal.

7. An integrated circuit chip in accordance with claim 5 wherein each of said logic elements is essentially a complementary-metal-oxide-semiconductor (CMOS) inverter.

* * * * *